United States Patent [19]
Wilcox

[11] Patent Number: 5,105,107
[45] Date of Patent: Apr. 14, 1992

[54] HIGH SPEED CMOS DIFFERENTIAL INTERFACE CIRCUITS

[75] Inventor: David J. Wilcox, Duston, United Kingdom

[73] Assignee: Gec-Marconi Limited, Stanmore, United Kingdom

[21] Appl. No.: 560,989

[22] Filed: Aug. 1, 1990

[30] Foreign Application Priority Data

Aug. 3, 1989 [GB] United Kingdom ............... 8917739

[51] Int. Cl.$^5$ .................. H03K 19/0175; H03K 3/01; G06K 7/12
[52] U.S. Cl. ................................ 307/475; 307/494; 307/296.8
[58] Field of Search ............... 307/494, 496, 443, 475, 307/296.4, 296.6, 296.8

[56] References Cited

U.S. PATENT DOCUMENTS

| | | | |
|---|---|---|---|
| 4,573,212 | 6/1986 | Svager | 307/443 |
| 4,622,480 | 11/1986 | Uchimura et al. | 307/496 |
| 4,645,951 | 2/1987 | Uragami | 307/443 |
| 4,727,265 | 2/1988 | Nanbu et al. | 307/443 |
| 4,779,015 | 10/1988 | Erdelyi | 307/443 |
| 4,783,604 | 11/1988 | Ueno | 307/443 |
| 4,808,848 | 2/1989 | Miller | 307/355 |
| 4,945,258 | 7/1990 | Picard et al. | 307/475 |

Primary Examiner—David Hudspeth
Assistant Examiner—Andrew Sanders
Attorney, Agent, or Firm—Fleit, Jacobson, Cohn, Price, Holman & Stern

[57] ABSTRACT

High speed CMOS differential input and output interface circuits comprise input and output means arranged to be controlled by biasing means. The biasing means generates a bias voltage. The output interface has a single ended to differential translator as the input means and an differential output stage as the output means. The input interface has a input amplifier and detector as the input means, and a differential to single ended level translator as the output means. The input and output interfaces operate at 300 MHz and 200 MHz respectively using clock encoded data, and both are capable of interfacing with bipolar devices. A combined input/output interface operates at 200 MHz using clock encoded data or 60 MHz under normal clocked operation.

3 Claims, 5 Drawing Sheets

HIGH SPEED CMOS DIFFERENTIAL INTERFACE CIRCUITS

The present invention relates to high speed input and output interface circuits for CMOS devices.

Standard CMOS output drivers have the disadvantages of only being capable of handling frequencies upto the order of 25 MHz without incurring penalties of excessive silicon area and supply "bounce".

An aim of the present invention is to provide interface circuits which are capable of the required high speed of operation, but do not suffer from the above mentioned disadvantages.

According to the present invention there is provided a high speed CMOS differential interface circuit comprising input means interconnected to output means, and biasing means connected to the input and output means and arranged to generate bias voltages for the input and output means.

According to an aspect of the present invention there is provided an interface circuit, wherein the circuit is an output interface circuit, the input means includes a translator arranged to convert an input signal to differential signals, and, the output means is a current generator providing a differential current for driving transmission lines, in accordance with the differential signals.

According to a further aspect of the present invention there is provided an interface circuit, wherein the circuit is an input interface circuit, the input means includes an amplifier and detector arranged to amplify detected differential input signals; and, the output means is a differential to single ended level translator arranged to convert the differential input signals to a single signal.

Embodiments of the present invention will now be described with reference to the accompanying drawings, wherein.

Figure 1:
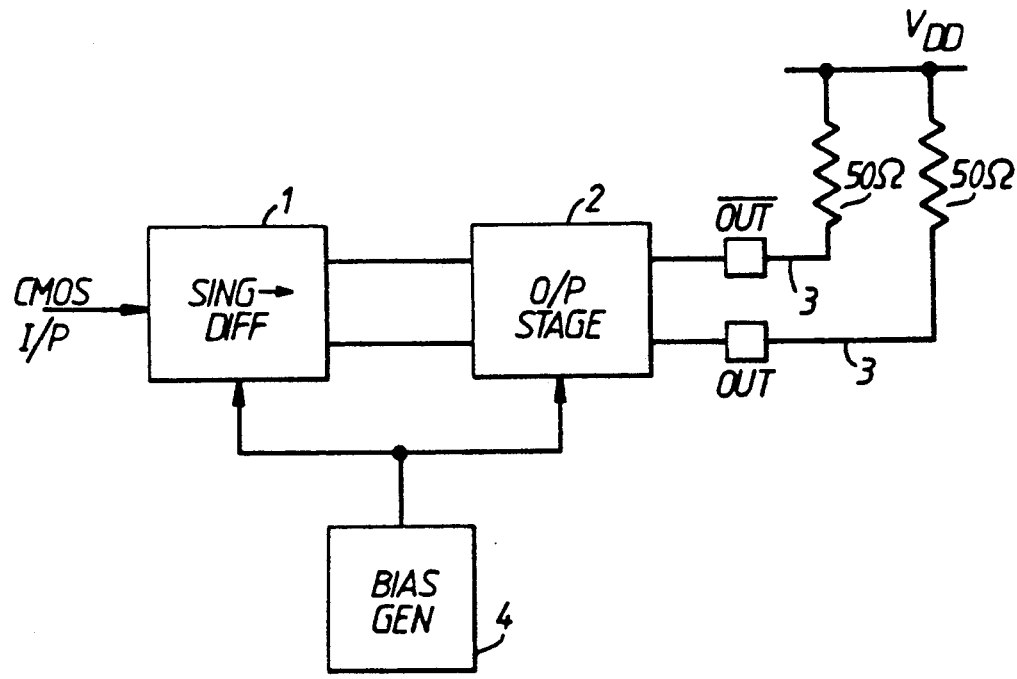
FIG. 1a shows a block diagram of an output interface circuit.
FIG. 1b shows a block diagram of an input interface circuit.
Figure 1:
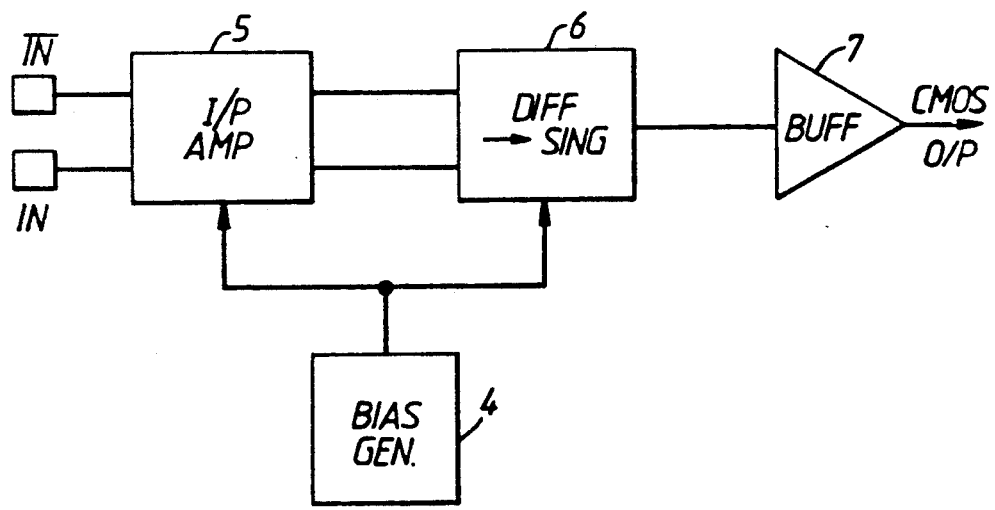

Referring to FIG. 1a, a block diagram of the output interface circuit is shown. The single-ended input to the interface with CMOS levels is converted to a differential signal, level shifted and attenuated, by converter 1, such that the input to the output stage 2 is a two volt differential signal with 4 V and 5 V single-ended levels. The output of the interface is a differential current capable of driving 50 ohm transmission lines 3 with a 1 V differential swing. A bias circuit, or reference bias generator 4, produces a control voltage which sets the differential output current and is used also to generate the bias currents for the single-ended to differential translator 1 and output stage 2.

Referring to FIG. 1b, a block diagram of the input interface circuit is shown. The nominal input is a 1 V differential signal with a single-ended swing between 4.5 V and 5 V. The input interface detects this input, amplifies it by amplifier 5 and converts it to a single-ended signal with CMOS levels in a differential to single-ended level translator. A bias circuit 4 identical to that mentioned above generates a control voltage which sets the bias currents for the differential amplifier input stage 5. The control voltage is also supplied to the translator 6. The output from translator 6 is buffered in circuit 7.

Figure 2:
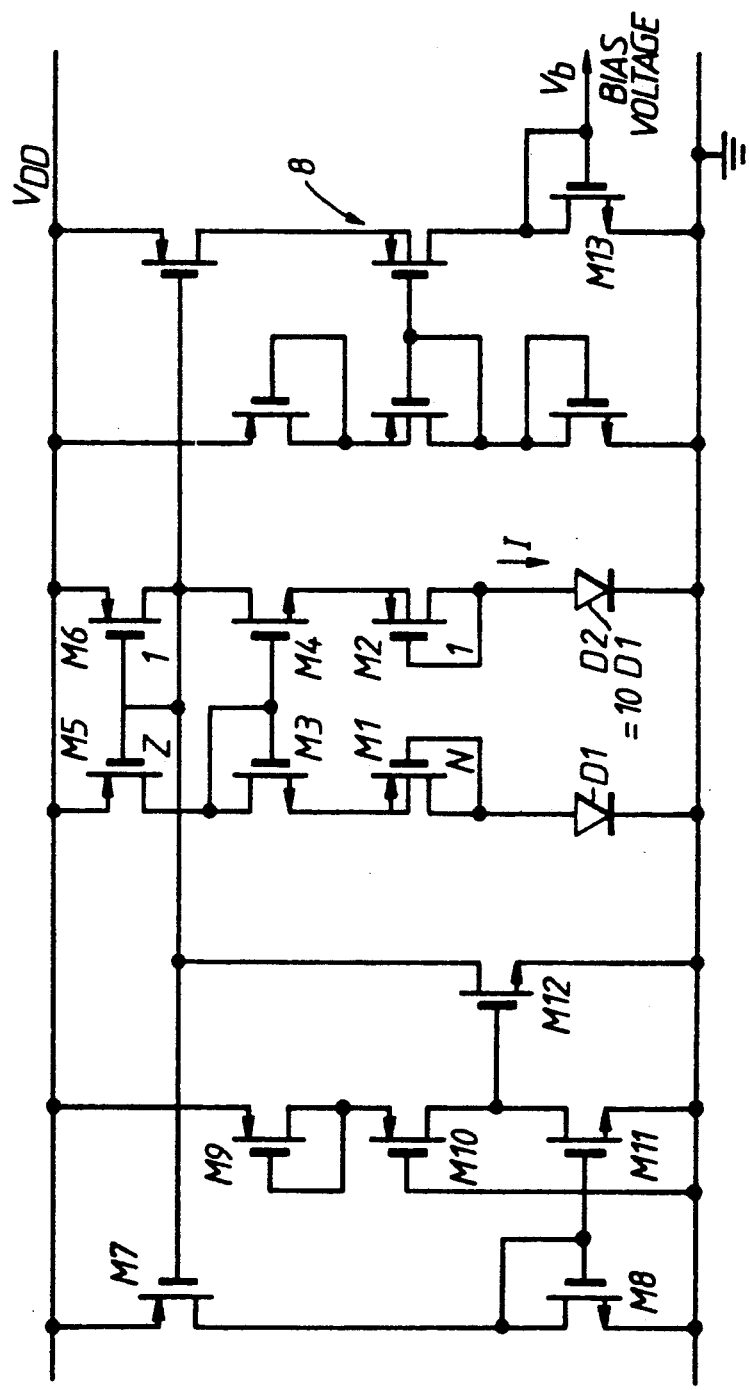
FIG. 2 shows a circuit diagram of a bias generator.

Referring to FIG. 2, the reference bias generator is shown in more detail. The current mirror M5, M6 biases diodes D1 and D2. The source voltages of devices M3, M4 are nominally equal implying that the dVbe of the diodes is dropped across M2. The wells of M1 and M2 are tied to their respective sources to eliminate the effects of substrate bias on the generated reference current I (N-well CMOS process). The reference current is given by $$I = BOO(P)^* \left[ \frac{W}{L}(M2) \right] \left[ \frac{dVbe - dVtm}{1 - (Z/N)^{0.5}} \right]^2$$

where dVtm is the voltage mismatch at the sources of devices M1, M2 due to threshold voltage mismatch of devices M1, M2 and M3, M4 and Z and N are the drawn width and length, W/L ratios of device pairs M5, M6 and M1, M2 respectively. BOO(P) is the current gain factor for p-channel MOS, PMOS devices. A cascoded current mirror 8 is used to generate the bias voltage Vb which is used to control bias currents in both input and output interfaces. A start-up circuit, devices M7–M12, is also incorporated.

Figure 3:
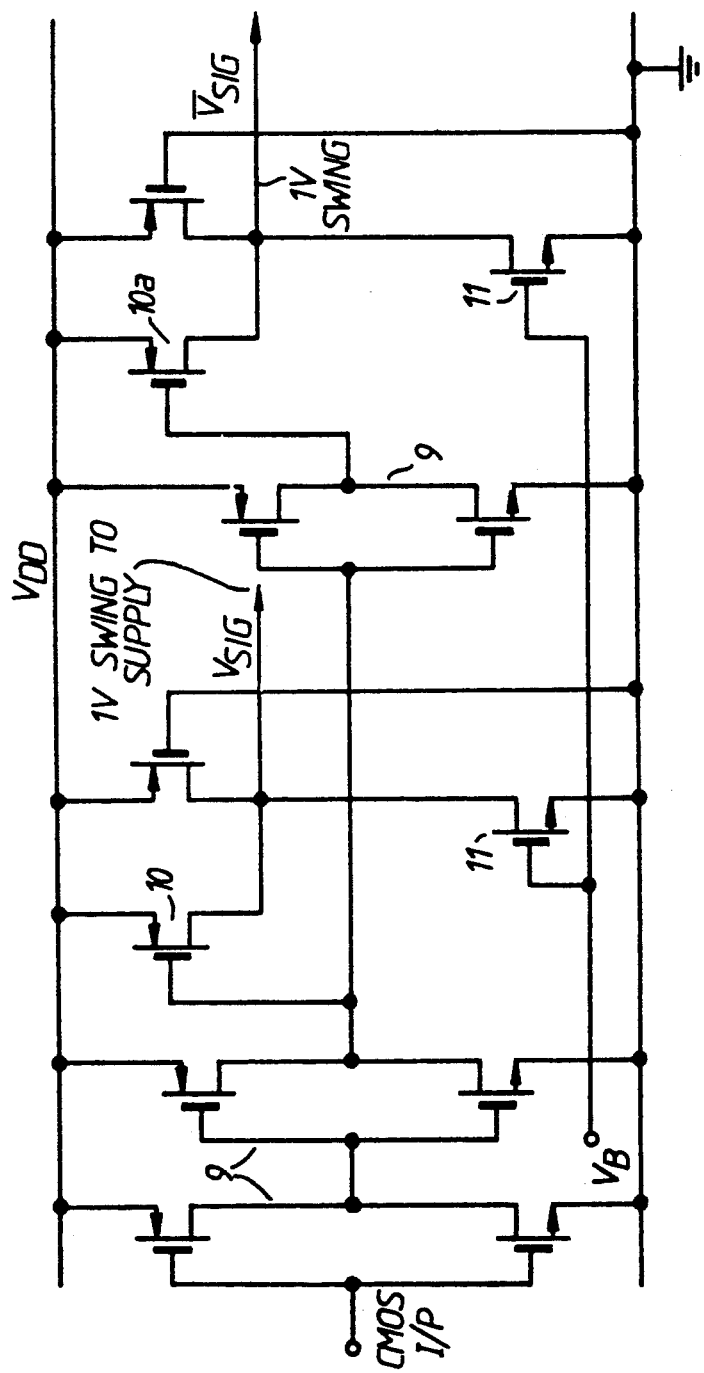
FIG. 3 shows a circuit diagram of a single-ended to differential level translator.

Referring to FIG. 3, the single-ended to differential level translator will now be described in detail. Incoming data is buffered by inverters 9 before driving first and second PMOS devices 10, 10a used to short the output nodes to Vdd to produce the single-ended output HIGH. Single-ended output LOW is nominally 1 V below Vdd and is set by a PMOS load 10 and 10a biased by a current source 11. The current source value is set by bias voltage $V_B$ and device width. The device length is the same as that of device M13 in the reference bias generator. The circuit produces two output signals $V_{SIG}$ and $\overline{V}_{SIG}$ for presentation to the circuit of FIG. 4.

The bias current generated by the reference bias generator is proportional to BOO(P), the p-channel MOSFET current gain, and hence the voltage dropped across the PMOS loads is independent of BOO(P) to the first order.

Figure 4:
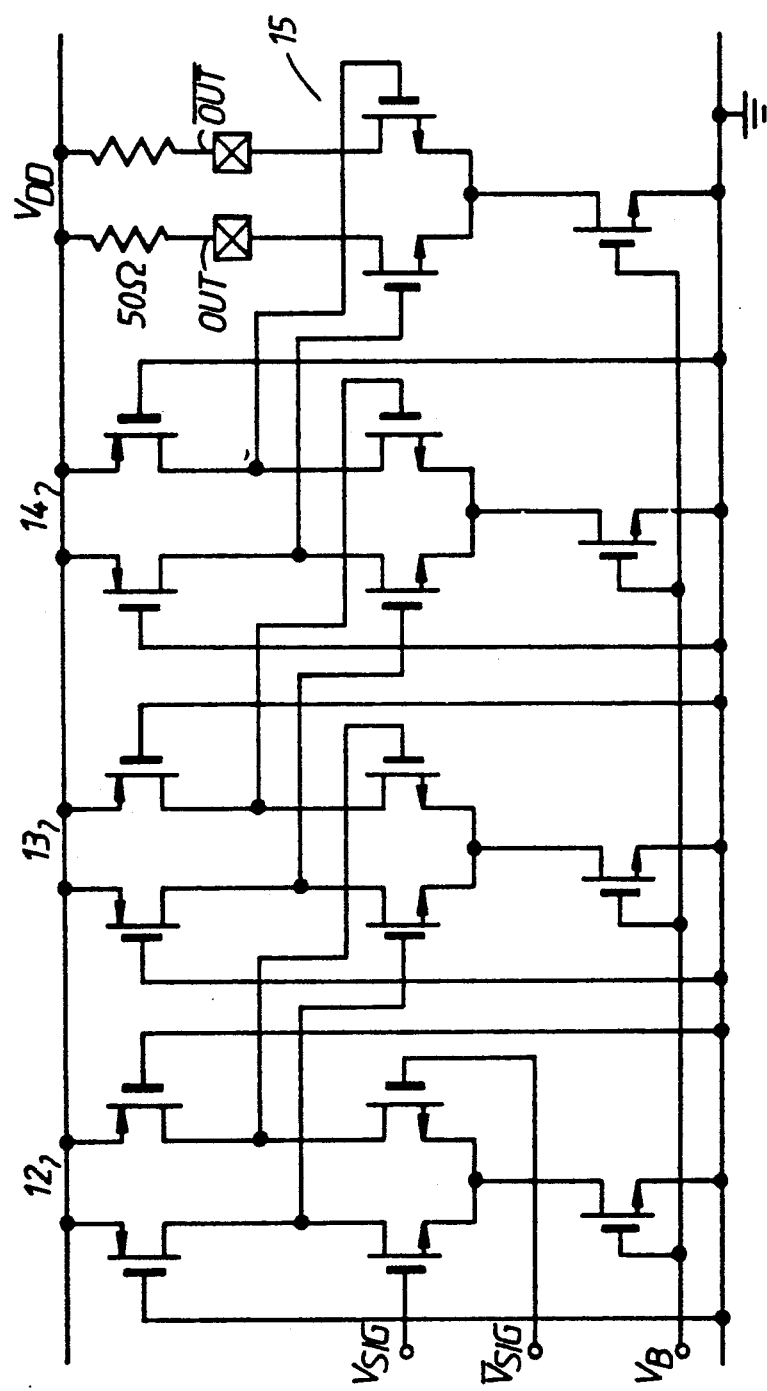
FIG. 4 shows a circuit diagram of a differential output stage; and, FIG. 5 shows a circuit diagram of an input amplifier and a differential to single-ended level translator.

Referring to FIG. 4, the output stage employs a cascade of source-coupled differential pairs 12–15 in which the bias currents are scaled by a factor of 3 between stages producing a nominal current in the final stage of 10 mA. The signals $V_{SIG}$ and $\overline{V}_{SIG}$ are presented to the first stage 12. The nominal differential output voltage swing of each stage (apart from the last) is 2 v pk-pk, i.e. the single ended outputs swing from 4 V to 5 V. The last stage 15 is capable of driving a 50 ohm load to produce a nominal differential output of 1 V pk-pk (500 mV single-ended). As detailed above the output voltage swing of each differential pair, apart from the last, is independent of P-channel BOO.

Figure 5:
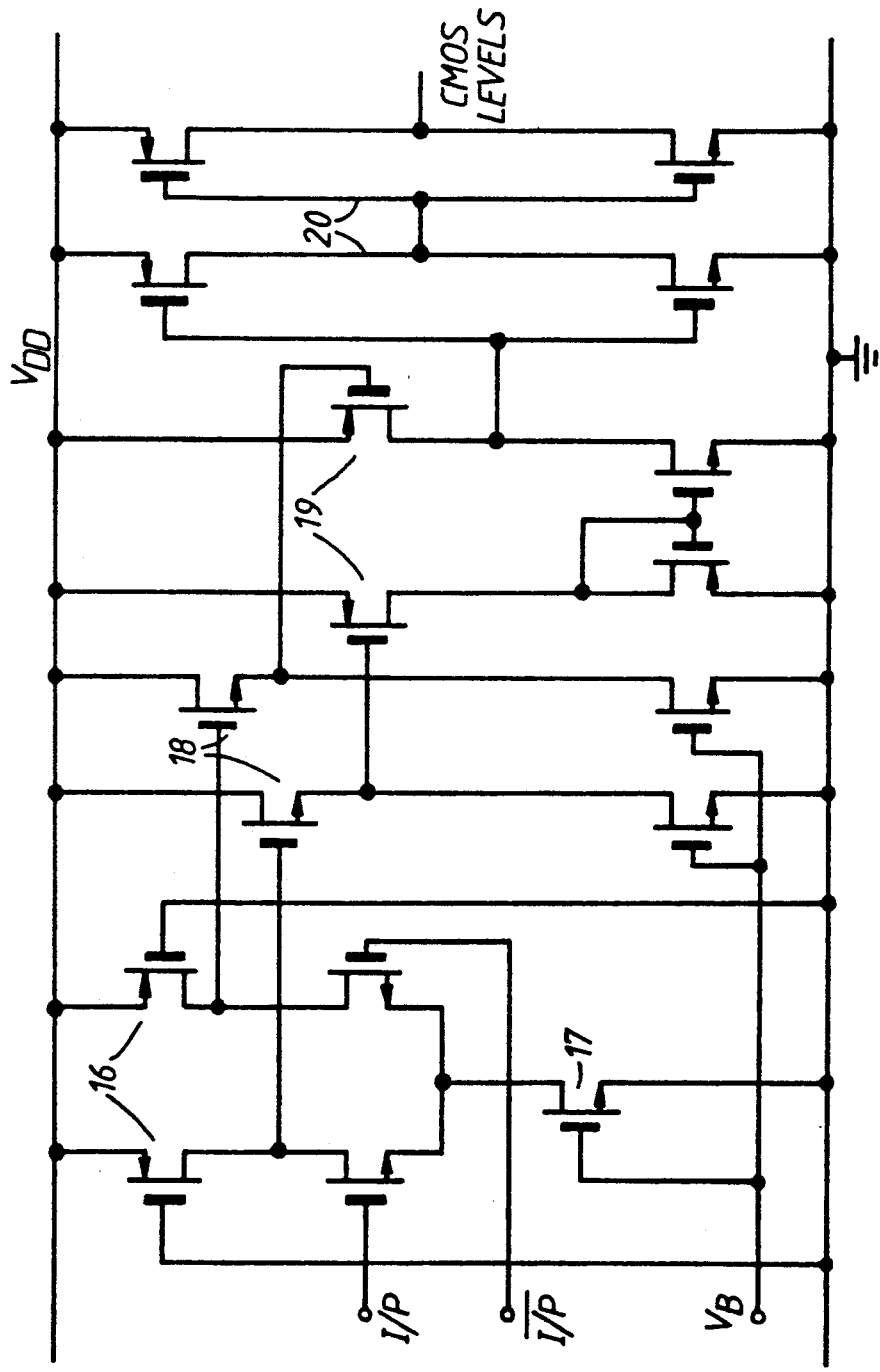

Referring to FIG. 5, the design of the first stage of the input interface, is based on the same principle as that employed in the output stage of the output interface. Incoming differential input signals I/P, $\overline{I/P}$ are amplified by a differential amplifier 16 employing PMOS loads biased by a current source 17 controlled by signal $V_B$ from a reference bias generator. The signal is then level shifted via source followers 18 to ensure that the output of the differential amplifier is able to turn ON the PMOS input devices 19 of the following differential to CMOS level translator. Two inverters 20 at the interface output are necessary to guarantee CMOS logic levels and to reduce output rise and fall times.

High speed differential input and output interfaces have been described which are capable of 300 MHz and 200 MHz operation respectively using clock encoded data. Speed is limited by single-ended to differential, and differential to single-ended level translators in output and input interfaces respectively. Taking into account delays associated with input and output latches etc. then normal clocked operation of the combined input/output interface is limited to 60 MHz. However, using clock encoded data the maximum operating frequency of the combined input/output interface is 200 MHz. Both interfaces are capable of interfacing with bipolar devices.

I claim:

1. A high speed CMOS differential interface circuit comprising input means interconnected to output means, and biasing means connected to the input and output means for generating a bias voltage for the input and output means wherein the biasing means comprises a current mirror, connected to a pair of diodes for biasing the pair of diodes such as to generate a reference current and a further current mirror for producing said bias voltage.

2. An interface circuit as claimed in claim 1, wherein the circuit is an output interface circuit, the input means includes a translator for converting an input signal to differential signals, and, the output means is a current generator providing a differential current for driving transmission lines, in response to the differential signals.

3. An interface circuit as claimed in claim 1, wherein the circuit is an input interface circuit, the input means includes amplifier and detector means for amplifying detected differential input signals; and, the output means is a differential to single ended level translator, connected to the amplifier and detector means, for converting the differential input signals to a single signal.

* * * * *